(12) United States Patent
Astgimath

(10) Patent No.: US 9,729,114 B2
(45) Date of Patent: Aug. 8, 2017

(54) LOW NOISE AMPLIFIER FOR MEMS CAPACITIVE TRANSDUCERS

(71) Applicant: Cirrus Logic International Semiconductor Ltd., Edinburgh (GB)

(72) Inventor: Santosh Astgimath, Edinburgh (GB)

(73) Assignee: Cirrus Logic International Semiconductor Ltd., Edinburgh (GB)

( * ) Notice: Subject to any disclaimer, the term of this patent is extended or adjusted under 35 U.S.C. 154(b) by 54 days.

(21) Appl. No.: 14/700,666

(22) Filed: Apr. 30, 2015

(65) Prior Publication Data

US 2015/0318829 A1 Nov. 5, 2015

(30) Foreign Application Priority Data

May 2, 2014 (GB) .................................. 1407790.3

(51) Int. Cl.
*H03F 99/00* (2009.01)
*H04R 3/00* (2006.01)
(Continued)

(52) U.S. Cl.
CPC ........... *H03F 3/505* (2013.01); *H03F 1/0205* (2013.01); *H03F 1/26* (2013.01); *H03F 3/183* (2013.01);
(Continued)

(58) Field of Classification Search
CPC H04R 2201/003; H04R 19/04; H04R 19/005; H04R 3/00; H04R 17/02;
(Continued)

(56) References Cited

U.S. PATENT DOCUMENTS 7,944,303 B2 5/2011 Cozzolino
8,022,765 B1 9/2011 Oo et al.
(Continued)

OTHER PUBLICATIONS

Combined Search and Examination Report under Sections 17 and 18(3), UK Patent Application No. GB1407790.3, mailed Nov. 3, 2014, 7 pages.

*Primary Examiner* — Paul S Kim
*Assistant Examiner* — Norman Yu
(74) *Attorney, Agent, or Firm* — Jackson Walker L.L.P.

(57) ABSTRACT

This application relates to amplifier circuitry for amplifying a signal from a MEMS transducer. A super source follower circuit (40) is provided which includes a feedback path from its output node ($N_{out}$) to a control bias node (BC) in order to provide a preamplifier signal gain that may be greater than unity. A first transistor (M1) is configured to have its gate node connected to an input node ($N_{IN}$) for receiving the input signal ($V_{IN}$) and its drain node connected to an input node (X) of an output stage (A). The source node of the first transistor is connected to the output node ($N_{OUT}$). A current source (I2) is configured to deliver a current to the drain node of the first transistor (M1), wherein the current source (I2) is controlled by a bias control voltage ($V_{BC}$) at the bias control node (BC). A feedback impedance network (Z1) comprising a first port connected to the output node ($N_{OUT}$) and a second port connected to the bias control node (BC) is provided.

20 Claims, 14 Drawing Sheets

(51) Int. Cl.
*H03F 3/50* (2006.01)
*H03F 1/26* (2006.01)
*H03F 3/183* (2006.01)
*H03F 3/187* (2006.01)
*H03F 1/02* (2006.01)
*H03G 1/00* (2006.01)
*H03G 3/00* (2006.01)

(52) U.S. Cl.
CPC ........... *H03F 3/187* (2013.01); *H03G 1/0088* (2013.01); *H04R 3/00* (2013.01); *H03F 2200/03* (2013.01); *H03F 2200/129* (2013.01); *H03F 2200/15* (2013.01); *H03F 2200/24* (2013.01); *H03F 2200/294* (2013.01); *H04R 2201/003* (2013.01)

(58) Field of Classification Search
CPC  H04R 19/016; H04R 2410/03; H04R 29/004; H04R 3/007; H04R 17/00; H04R 2410/00; H04R 2499/11; B81B 2201/0257; H01L 2924/1461; H03F 2200/03; H03F 1/223; B81C 1/00158; H03H 9/02
USPC ........ 381/113, 174, 111, 120, 122, 102, 106, 381/114, 121; 257/416; 330/296, 277, 330/278, 282, 291, 305
See application file for complete search history.

(56) References Cited

U.S. PATENT DOCUMENTS

| | | |
|---|---|---|
| 2012/0155675 A1* | 6/2012 | Froehlich ................ H03F 1/523 381/120 |
| 2013/0064397 A1 | 3/2013 | Dunser |
| 2014/0064523 A1 | 3/2014 | Kropfitsch et al. |
| 2014/0119573 A1* | 5/2014 | Kropfitsch .............. H03F 1/086 381/120 |

\* cited by examiner

LOW NOISE AMPLIFIER FOR MEMS CAPACITIVE TRANSDUCERS

RELATED APPLICATION

The present disclosure claims priority to British Patent Application No. 1407790.3 filed on May 2, 2014, which is incorporated by reference herein in its entirety.

This invention relates to methods and apparatus for amplifying the signal from a MEMS capacitive transducer, and, in particular, the use of a low noise pre-amplifier based on a super source follower.

Micro-electromechanical-system (MEMS) transducers, such as MEMS microphones, are finding application in a range of devices. The MEMS transducer is typically connected to an amplifier to amplify the signal from the transducer. The amplifier, also referred to as a pre-amplifier or a low noise amplifier (LNA), is preferably connected close to the transducer to reduce losses from e.g. parasitic shunt capacitances before amplification.

FIG. 1 illustrates a MEMS microphone 2, an associated amplifier 4 and bias circuitry 6. A stable voltage $V_R$, derived from the supply voltage $V_{DD}$ is boosted by a charge pump 8 to bias one terminal of the capacitive transducer 2 ($C_{MEMS}$) with a suitable voltage $V_{CP}$, for example 12V. The other terminal of the transducer 2 is biased to another fixed voltage, typically ground, via a very high impedance 10, for example, in the order of 10 GΩ. An example of the type of component which could be used to produce this impedance is a network of polysilicon diodes. Acoustic waves incident on the capacitive transducer 2 will cause displacement of one of the electrode plates, thus changing the spacing between it and another electrode plate and, as a result, changing the inter-electrode capacitance. As the second terminal of the transducer 2 is only biased via a very high impedance, these changes in capacitance cause a signal voltage $V_{IN}$ to appear at the input terminal. Typically, the capacitive transducer 2 has a capacitance in the order of 1 pf and the signal voltage produced by average sound levels at the input terminal is in the order of 10 mV rms. Therefore, in order to drive any following circuitry presenting loads of, for example, 500 pf of cable and 10 kΩ input impedance, without significant attenuation of this small signal, a low input capacitance and low noise pre-amplifier 4 is required.

Pre-amplifiers conventionally comprise long-tailed pair input stages. However, for some applications, especially where low power is more important than absolute performance, simpler pre-amplifiers may be more appropriate than the conventional long-tailed pair input stages which may, for example, require a relatively large power consumption for the same noise performance.

One example of a simple fixed gain low noise amplifier is a Class A source follower comprising a MOS transistor with its gate coupled to the MEMS transducer and its source coupled to the amplifier output and to a constant current bias source. However, this is not ideal in terms of distortion or linearity and is wasteful of power. Also, signal components of the current delivered to a load impedance that is connected to the amplifier output are provided by similar modulation of the current flowing through the MOS transistor, resulting in a signal dependent variation in the gate-source voltage of the MOS transistor. This gives a load-dependent attenuation of the output signal, which also becomes significantly non-linear for large output signal swings, causing output signal distortion. In other words, the non-zero output impedance of the source follower gives a load-dependent gain and the signal dependence of this output impedance introduces distortion of large output signals. The output impedance may be reduced by using higher bias currents but this gives rise to an undesirably higher power consumption.

Although simpler and lower power than amplifiers comprising long-tailed pair input stages, conventional source follower amplifiers have a gain inherently fixed approximately at unity or less. The gain of such source follower amplifiers cannot be readily adjusted, as might be desirable to compensate for part-to-part manufacturing variations in the transducer sensitivity, or to provide a gain adjust to match the dynamic range of particular downstream circuitry, or for gain adjustment during use.

Embodiments of the present invention relate to amplifier circuits for MEMS capacitive transducers that at least partly mitigate at least some of the disadvantages mentioned above.

According to the present invention there is provided an amplifier circuit for receiving an input signal from a MEMS transducer at an input node, and delivering an amplified output signal at an output node, the amplifier circuit comprising: an output stage with an output connected to the output node; an input stage comprising, a first transistor, having its gate node connected to the input node, its source node connected to the output node and its drain node connected to an input of the output stage; a current source configured to deliver a current to the drain node of said first transistor, wherein said current source is controlled by a bias control voltage at a bias control node; and a feedback impedance network comprising a first port connected to the output node and a second port connected to the bias control node.

The feedback impedance network may comprise at least a first capacitor between the first port and the second port.

The feedback impedance network may have a third port connected to a reference voltage and it may form a potential divider with the second port delivering an attenuated version of the output signal, in which case, the feedback impedance network may comprise at least a second capacitor between the second port and the third port. In some embodiments, the potential divider is configured as an adjustable or variable potential divider.

The feedback impedance network may comprise at least one capacitor and at least one resistor. In some embodiments, the feedback impedance network comprises an adjustable capacitance.

The feedback impedance network may comprise a plurality of capacitive components and a network of switches. Said network of switches may be configured for selectively connecting one or more of said plurality of capacitive components to the second port, and or to the first port or third port. In some embodiments the amplifier circuit further comprises a switch controller and at least one digital storage element, wherein said switch controller may be configured to control said network of switches based on the content of said digital storage element. The digital storage element may comprise non-volatile memory.

In some embodiments, the bias control node is connected to a bias voltage via a high impedance structure wherein the high impedance structure may comprise at least one polysilicon diode. The amplifier circuit may further comprise a switch across the high impedance structure.

In some embodiments, the current source is a second transistor with its drain node connected to the drain node of the first transistor, its gate node or its body node connected to the bias control node, and its source node connected to a reference voltage.

In some embodiments, the output stage comprises a third transistor with its drain node connected to the output node, its source node connected to a reference voltage, and its gate node connected to the input node of the output stage.

In some embodiments, the amplifier circuit may further comprise a circuit element coupled between a supply voltage and the output node. The circuit element may comprise a resistor or a fourth transistor configured as a constant current source.

In some embodiments, the drain node of the fourth transistor is connected to the output node, the source node of the fourth transistor is connected to the supply voltage, and the gate node of the fourth transistor is coupled to the input node of the output stage to provide a Class AB output configuration.

In some embodiments, the drain of the fourth transistor is connected to the output node, the source node is connected to the supply voltage, and the gate node is coupled to a fifth transistor. The gate and drain nodes of the fifth transistor may be coupled to the input of the inverting output gain stage to vary the dependence of the fourth transistor on the voltage at said input of the output stage.

The output stage may be an inverting output gain stage.

The amplifier circuit may be implemented as an integrated circuit. In some embodiments the MEMS transducer may be formed on a monolithic substrate with the amplifier circuit. The MEMS transducer may be a MEMS microphone. The integrated circuit may be packaged.

Embodiments of the invention may be used in an electronic device which may be at least one of: a portable device; a battery powered device; a computing device; a communications device; an audio device; a personal media player; a games device; a mobile telephone; a laptop computer and a tablet computing device In another aspect of the invention there is provided a method of amplifying an input signal from a MEMS transducer and delivering an amplified output signal to an output node comprising;
  receiving the input signal at the gate node of a first transistor, wherein
    the source node of the first transistor is connected to the output node and the drain node of the first transistor is connected to an input of an output stage which has an output connected to the output node,
  delivering a current from a current source to the drain node of said first transistor, and
  controlling the current source with a bias control voltage at a bias control node by feeding back the output signal via a feedback impedance network to the bias control node.

The method may be implemented in any of the variants described above in relation to the first aspect of the invention.

In another aspect of the invention there is provided an amplifier circuit for amplifying an input signal from a transducer to provide an output signal at an output node, the amplifier circuit comprising:
  a super-source follower circuit comprising:
    an input transistor configured to be driven by said input signal, and
    a current reference transistor, connected in series with said input transistor, configured to be driven from a bias control node to provide a current reference for said input transistor, wherein the bias control node is configured to receive a bias voltage to provide a quiescent voltage on said bias control node; and
  a feedback path between the output node and the bias control node, said feedback path comprising an impedance network configured to superimpose at least a fraction of said output signal onto the quiescent voltage on said bias control node.

In some embodiments the amplifier circuit comprises a bias impedance configured to couple a bias voltage onto said bias control node to provide said quiescent voltage on said bias control node.

In another aspect of the invention there is provided an amplifier circuit for amplifying an input signal from a transducer to provide an output signal at an output node, the amplifier circuit comprising:
  a super-source follower circuit further comprising circuitry configured to modulate the current applied to an input transistor based on the output signal.

In another aspect of the invention there is provided an amplifier circuit for amplifying an input signal from a transducer to provide an output signal at an output node, the circuit comprising:
  a super-source follower circuit having a controllable gain.

In another aspect of the invention there is provided an amplifier circuit for amplifying an input signal from a transducer to provide an output signal at an output node, the circuit comprising:
  a super-source follower circuit configured to have a gain greater than unity.

In some embodiments the amplifier circuit may comprise a switch network configured to control a fraction of the output signal fed back to the bias control node so as control said gain.

In another aspect of the invention there is provided an amplifier circuit for amplifying an input signal from a transducer to provide an output signal at an output node, the circuit comprising:
  a super-source follower circuit.

In another aspect of the invention there is provided an amplifier circuit for amplifying an input signal from a transducer, the circuit comprising super-source follower means to provide an output signal at an output node, In another aspect of the invention there is provided an integrated MEMS transducer on a monolithic substrate comprising:
  a MEMS transducer element,
  a charge pump,
  bias generation circuitry, and
  a pre-amplifier configured as a super source follower with programmable gain.

In another aspect of the invention there is provided an integrated MEMS transducer on a monolithic substrate comprising:
  a MEMS transducer element,
  a charge pump,
  bias generation circuitry, and
  a pre-amplifier comprising super source follower means.

For a better understanding of the presenting invention, and to show how it may be put into effect, reference will now be made, by way of example, to the accompanying drawings, in which.

DESCRIPTION

The present invention provides a pre-amplifier circuit which uses a super source follower to maintain a low output impedance and stable signal gain.

Figure 2:
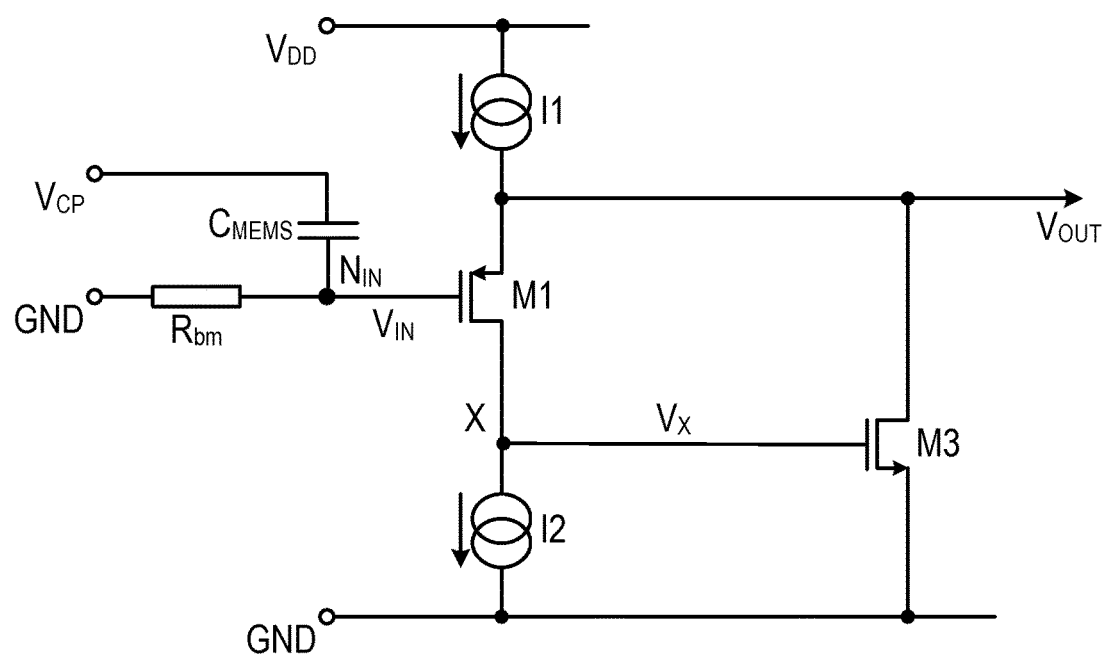
FIG. 2 illustrates an amplifier circuit implemented as a Class A super source follower.

As discussed above in some applications relatively simpler amplifiers may be more appropriate than the conventional long-tailed pair input stages. However a conventional source follower arrangement may suffer from a load-dependent gain and distortion of large output signals. The use of a Class A super source follower may provide a lower output impedance than an conventional source follower while requiring less supply current. FIG. 2 illustrates an amplifier comprising a super source follower arrangement. This implementation of a MEMS transducer amplifier comprises a class A super source follower. There are two MOS transistors, M1 and M3, which, in this example, are a PMOS and a NMOS transistor respectively. Constant current sources I1 and I2 are also provided, connected as shown. These may also be implemented using MOS transistors, using standard design techniques.

Figure 1:
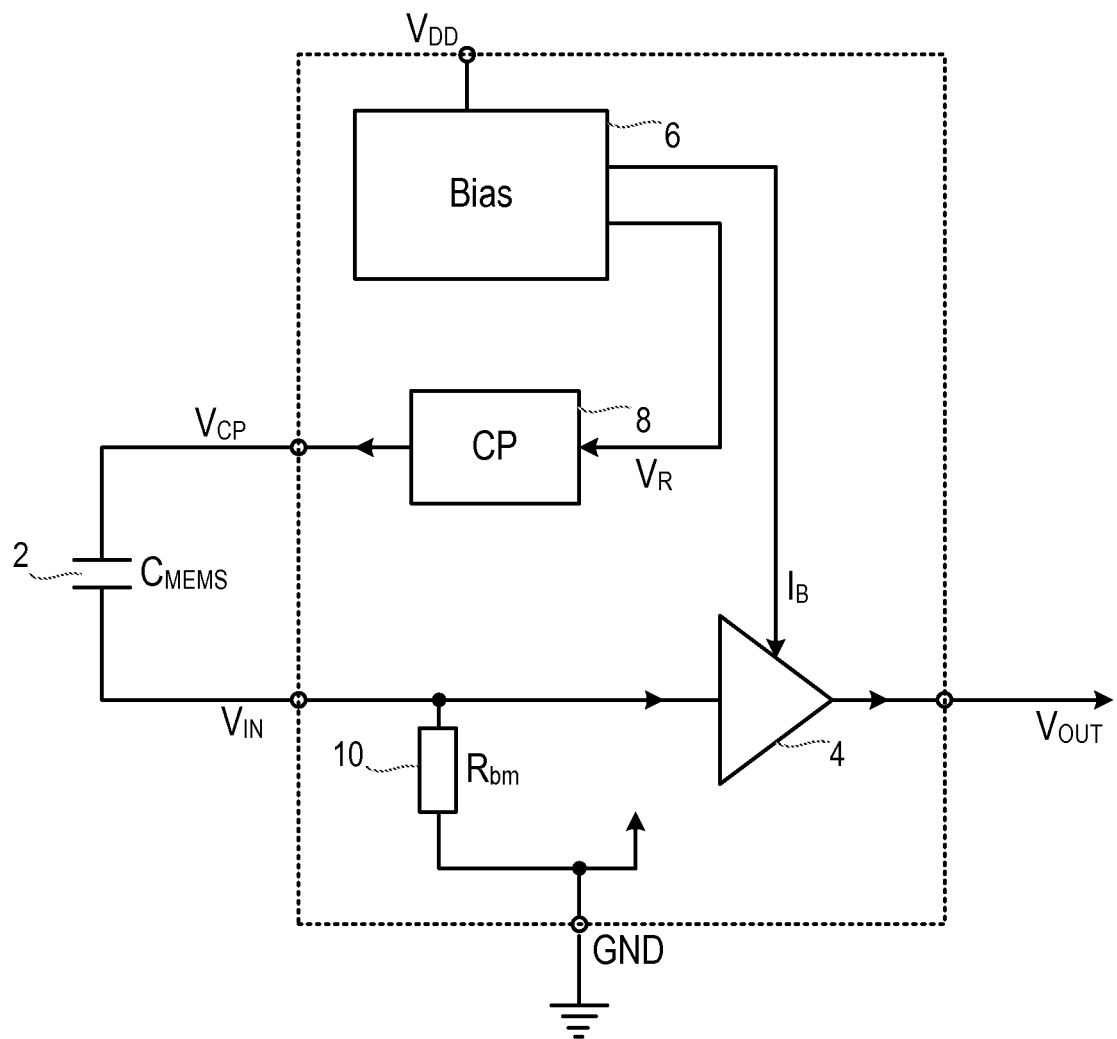
FIG. 1 illustrates a conventional pre-amplifier circuit for a MEMS transducer.

The transistor M1 is connected between the constant current source I1 and the constant current source I2. The source node of transistor M1 is coupled to the output voltage node and to the constant current source I1. The drain node of transistor M1 is connected at a node X to the constant current source I2. The drain node of transistor M1 is connected to the gate node of transistor M3. The source node of transistor M3 is connected to a reference voltage, which in this embodiment is ground. The drain node of transistor M3 is connected to the output voltage terminal $V_{OUT}$ of the amplifier circuit. The gate node of the first transistor M1 is coupled (for example via a series ESD protection resistor, not illustrated) to receive an input signal $V_{IN}$ from a MEMS capacitive transducer $C_{MEMS}$. This transducer is biased and functions in the same way as described with reference to FIG. 1.

This super source follower uses a negative feedback loop comprising the transistors M1 and M3 to reduce the amplifier output resistance. Assuming that the input voltage $V_{IN}$ is constant, and the output voltage, $V_{OUT}$, is increased due to some injected test current stimulus injected at the $V_{OUT}$ terminal the gate-source voltage of the transistor M1 will increase, resulting in an increase in the drain current of the transistor M1, and thus causing the voltage $V_X$ at node X to increase. This causes an increased gate-source voltage of the transistor M3. This increases the drain current of the transistor M3 which tries to absorb the injected test current and bring the output voltage, $V_{OUT}$, back towards its original voltage.

The circuit may be designed so that the voltage gain from $V_{OUT}$ to $V_X$ through the transistor M1 is large. Therefore, only a small variation of $V_{OUT}$ is enough to alter the gate source voltage of the transistor M3 enough to absorb almost all the injected current. By means of the negative feedback, and since current through I2 has nowhere to go except via the drain of the transistor M1, the current through the transistor M1 is always very close to the current through I2. This maintains the same gate source voltage irrespective of output current loading (or for that matter the applied input voltage $V_{IN}$) and thus reduces the closed-loop output impedance almost to zero.

Although not shown for reasons of simplicity, the bulk terminal of the transistor M1, in this and other embodiments, may preferably be connected to its source terminal. Otherwise, the influence of body effect on the threshold voltage of the transistor M1 would modulate its gate-source voltage with signal voltage, which would lead to a gain reduction and increased signal distortion.

In more detail, and allowing for the finite output resistance $r_1$ of M1, the output resistance of a super source follower such as this can be expressed as:

$$\frac{1}{g_{m1}g_{m3}r_1} \quad \text{Equation (1)}$$

$$\text{where } g_{mi} = \sqrt{2\beta_i I_{DSi}}, \beta_i = k\left(\frac{W_i}{L_i}\right) \text{ and} \quad \text{Equation (2)}$$

$$r_1 = \frac{1}{\lambda I_{DS1}} \quad \text{Equation (3)}$$

where λ is the channel length modulation coefficient, $I_{DS1}$ is the drain source current through the transistor M1, $W_i$ and $L_i$ define the width and length of the MOS channel of the transistor Mi (i=1, 2 . . . ), and k' is a process dependent physical parameter dependent primarily on the oxide thickness and the carrier mobility (which may be different for PMOS and NMOS). Thus the output impedance $g_{m1}$ that would be presented by a simple source follower comprising the transistor M1 is reduced by the open loop gain $g_{m3}r_1$.

As mentioned above the use of a Class A super source follower may thus provide a lower output impedance than an conventional source follower, or the same output impedance at less supply current, even allowing for the quiescent current required by the transistor M3, or some intermediate compromise. A lower output impedance provides a signal gain more insensitive to any loading impedance and with less distortion. However, the amplifier gain of such a Class A super source follower is inherently fixed at close to unity.

In embodiments of the invention, the super source follower circuit may be modified to include a feedback path from its output node to its bias node to provide a preamplifier signal gain that may be greater than unity. The feedback path may comprise at least one impedance and may comprise a potential divider.

Figure 3A:
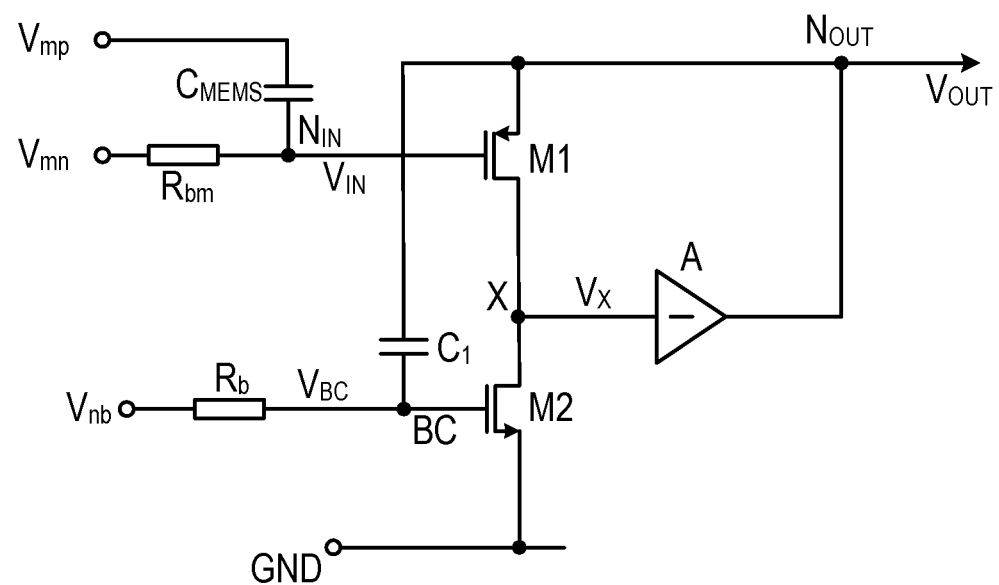
FIG. 3A illustrates an amplifier circuit according to embodiments of the present invention.

FIG. 3A illustrates an amplifier circuit according to an embodiment of the invention based on a super source follower, but adapted to provide a gain greater than unity, i.e. a low noise amplifier for receiving an input signal $V_{IN}$ from a MEMS capacitive transducer and producing an amplified output signal $V_{OUT}$. The amplifier circuit includes an output stage A, in this case an inverting output gain stage, for producing the output signal $V_{OUT}$ at an output node $N_{OUT}$. Coupled to the input node X of the inverting output gain stage A is an input stage comprising first and second transistors, M1 and M2, which in this embodiment are PMOS and NMOS transistors respectively.

It will be appreciated that the input and output stages need not necessarily constitute separate or physically discrete functional elements, and typically may be integrated together on a monolithic integrated circuit. In some embodiments certain elements may function as part of the input stage and also the output stage. The output stage A may be an amplifying output stage or an inverting output gain stage.

The input signal $V_{IN}$ is used to drive the first transistor M1, which may therefore be referred to as an input transistor. The first (input) transistor M1 is coupled between the output node and the input node of the inverting output gain stage A. Collectively, the first and second transistors M1 and M2 (i.e. the input stage) together with output stage A form a super source follower as described previously, with the second transistor M2 being coupled to a suitable bias voltage $V_{nb}$ to provide a current reference. The second transistor M2 may therefore be referred to as a current reference transistor. The current supplied by current reference transistor M2 is controlled by a bias control voltage $V_{BC}$ at a bias control node BC, which, in this embodiment, is the gate node of current reference transistor M2. In this embodiment the bias control node BC is coupled to a suitable applied bias voltage $V_{nb}$ via a high value impedance $R_b$. The gate node of the first transistor M1 is coupled (for example via a series ESD protection resistor, not illustrated) to receive an input signal $V_{IN}$ from a MEMS capacitive transducer $C_{MEMS}$. This transducer is biased and functions in the same way as described with reference to FIG. 1.

The transistors M1 and M2 are connected in series between a reference voltage, which in this embodiment is ground, and the output voltage terminal $N_{OUT}$ of the amplifier circuit. In this example, the source node of transistor M2 is coupled to the reference voltage, the drain node of transistor M1 is coupled to the drain node of transistor M2, and the source node of transistor M1 is coupled to the output voltage node $N_{OUT}$. The input of the inverting output gain stage A is connected to a node X between the transistors M1 and M2. In this example, the drain nodes of both transistors M1 and M2 are connected together and connected to the input terminal of the output stage A. The output terminal of the inverting output gain stage A is connected to the output voltage terminal $N_{OUT}$ and the source terminal of the transistor M1. Therefore, a feedback loop is formed through the inverting output gain stage A and through the source and drain nodes of the transistor M1.

In the absence of the capacitor $C_1$ shown in FIG. 3A, the second transistor M2 acts as a simple constant current source defining a fixed drain reference current flowing from drain to source and applied to the drain of transistor M1. The negative feedback loop through inverting output gain stage A forces exactly this reference current through the transistor M1. Therefore, to first order, the gate-source voltage of the input transistor M1 is forced to be constant, as in the embodiment of FIG. 2. Thus in the absence of the capacitors $C_1$ and $C_2$, any change in the input voltage $V_{IN}$ would be transferred straight through to the output voltage $N_{OUT}$ at unity gain.

However, when the capacitor $C_1$ is present, connected between amplifier output node $N_{OUT}$ and the bias control node BC, it acts to modify the behaviour of the amplifier circuit to provide a gain through the circuit of greater than unity. The capacitor $C_1$ provides a feedback path through which the bias voltage on the gate of the transistor M2 is modulated by variations in the signal voltage on the amplifier output node $N_{OUT}$. Any change $\Delta V_{OUT}$ in the output voltage $N_{OUT}$ will couple onto the gate node of the transistor M2. The change $\Delta V_{GS2}$ in the gate-source voltage $V_{GS2}$ of the transistor M2 can then be expressed by:

$$\Delta V_{GS2}=\Delta V_{OUT},\qquad\text{Equation (4)}$$

This gives rise to a change in the current through the transistor M2 which can be expressed as:

$$\Delta I_{DS2}=g_{m2}\cdot\Delta V_{GS2}\qquad\text{Equation (5)}$$

Since the inverting output gain stage A has a high input impedance, this current must flow through the transistor M1. Hence, the change in the current through the transistor M1 is the same as the change in current through the transistor M2;

$$\Delta I_{DS1}=\Delta I_{DS2}.\qquad\text{Equation (6)}$$

This will give rise to a change in the gate-source voltage of the transistor M1:

$$\Delta V_{GS1}=\frac{\Delta I_{DS1}}{g_{m1}},\qquad\text{Equation (7)}$$

which will then lead to a change in the input-output differential such that $$\Delta V_{OUT}=\Delta V_{IN}+\Delta V_{GS1}.\qquad\text{Equation (8)}$$

By combining all of these equations the following result for the gain of the circuit is achieved:

$$\frac{\Delta V_{OUT}}{\Delta V_{IN}}=\frac{1}{\left(1-\sqrt{\frac{\beta_2}{\beta_1}}\right)}\qquad\text{Equation (9)}$$

Hence the gain of the circuit will then depend on the aspect ratio, $\beta_2/\beta_1$ (where $\beta_i$ is defined as in reference to FIG. 2), and be positive and greater than unity provided that $\beta_2/\beta_1<1$. The ratio $\beta_2/\beta_1$ is defined by ratios of the width and length of the transistors and the ratio of the k' values for PMOS and NMOS transistor structures used. This ratio is thus predictable and stable, being defined by physical dimensions and process parameters, though its dependence of the k' values may contribute a small net temperature dependent coefficient due to the slightly different temperature coefficients of the hole and electron mobilities on which it depends.

In general, it is preferable that $\beta_2/\beta_1$ is less than unity as the noise contribution of the second transistor M2 relative to the first transistor M1 is dependent on this ratio. This condition is also necessary to prevent the feedback via the capacitor $C_1$ and the transistor M2 from the output node $N_{OUT}$ to the node X exceeding the coupling from the output node $N_{OUT}$ to the node X via the transistor M1 and causing a net overall positive feedback via the inverting output gain stage A, which would result in a possible lock-up of the circuit.

Figure 3B:
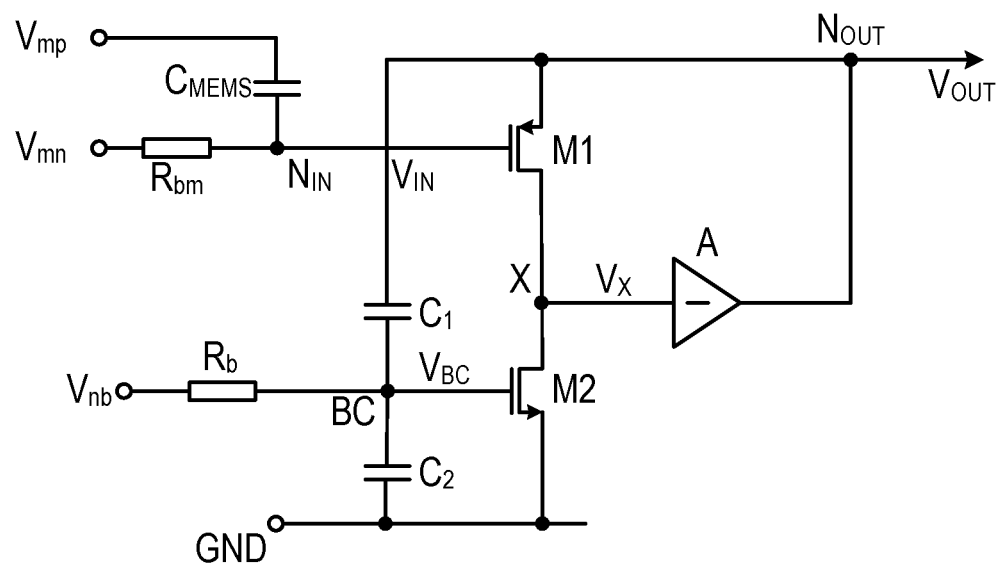
FIG. 3B illustrates an amplifier circuit according to embodiments of the present invention.

FIG. 3B illustrates an amplifier according to a further embodiment of the present invention. In this embodiment, rather than the single capacitor $C_1$ providing a feedback path through which the bias voltage on the gate node of the transistor M2 is modulated by variations in the signal voltage on the amplifier output node, a feedback path is instead provided by two capacitors, $C_1$ and $C_2$, connected in series between the output voltage $V_{OUT}$ and the reference voltage (ground) with their common node connected to the bias control node BC, which is connected to the gate of transistor M2. These two capacitors, $C_1$ and $C_2$, connected in series between the output voltage $V_{OUT}$ and the reference voltage (ground), form a potential divider through which the bias voltage on the gate of the transistor M2 is modulated. Any change $\Delta V_{OUT}$ in the output voltage $V_{OUT}$ will couple, attenuated by the capacitive potential divider, onto the gate node of the transistor M2. The change $\Delta V_{GS2}$ in the gate-source voltage $V_{GS2}$ of the transistor M2 can then be expressed by:

$$\Delta V_{GS2} = \alpha \Delta V_{OUT}, \text{ where} \qquad \text{Equation (10)}$$

$$\alpha = \frac{C_1}{C_1 + C_2}.$$

Then by analysis similar to that shown in reference to FIG. 3A, the following result for the gain of the circuit is achieved:

$$\frac{\Delta V_{OUT}}{\Delta V_{IN}} = \frac{1}{\left(1 - \alpha \sqrt{\frac{\beta_2}{\beta_1}}\right)}. \qquad \text{Equation (11)}$$

Hence the gain of the circuit will then depend on the aspect ratio $\beta_2/\beta_1$, and also the value of $\alpha$.

As expected, if $\alpha=0$, e.g. if there are no capacitors, the gain reverts to unity. If $C_2$ is absent then $\alpha=1$ and the equation reverts to that of Equation (9). However, when capacitors $C_1$ and $C_2$ are both present, then $\alpha$ will always be less than unity. It then follows that if the aspect ratio $\beta_2/\beta_1$ is less than $1/\alpha^2$, then the second term in the denominator of equation 11 will be less than 1 but greater than zero, and hence the gain, $$\frac{\Delta V_{OUT}}{\Delta V_{IN}},$$

will be greater than unity.

This potential divider circuit then advantageously provides a gain greater than unity when operatively used in conjunction with using a simple output stage super source follower circuit.

The addition of the second capacitor $C_2$ may provide a more accurate gain as this capacitor may swamp, i.e. be greater than, uncorrelated parasitic capacitances on the bias control node BC, including the input capacitance of the transistor M2. The increased capacitance on the bias control node BC, acting as a low pass filter in conjunction with the bias impedance Rb, may also filter out noise from any upstream bias generation circuitry.

In an embodiment of the invention in an integrated circuit $C_1$ and $C_2$ may be of the order of 1 pf, or in the range 0.1 pf to 10 pf. One implementation comprises a capacitor $C_2$ with a value of 6 pF and a capacitor $C_1$ with a value of 1 pf, giving a gain of approximately 1.5.

Thus in some embodiments of the present invention, not only is the output signal $V_{OUT}$ fed back to the input transistor M1, as described above with the conventional super source follower arrangements, to provide negative feedback to reduce the output impedance and stabilise the transfer function, but in addition, a feedback signal derived from the output signal $V_{OUT}$ and applied to a bias control node BC is also used to modulate a reference current for the input transistor M1. For example, in the embodiments of FIGS. 3A and 3B, the reference current is modulated by modulating the gate voltage of the current reference transistor M2. This provides limited positive feedback in order to increase the gain above unity.

This positive feedback path may be unattenuated, as in the implementation of FIG. 3A. Alternatively an attenuator such as a voltage divider may be used to reduce the signal derived from the output signal to provide the feedback signal. FIG. 3B illustrates a capacitive divider formed by the capacitors $C_1$ and $C_2$, but it will be appreciated that other potential dividers, or attenuators, could be used. More generally any type of suitable level-shifter may be used to provide a desired level-shift or attenuation for the feedback signal.

Figure 4A:
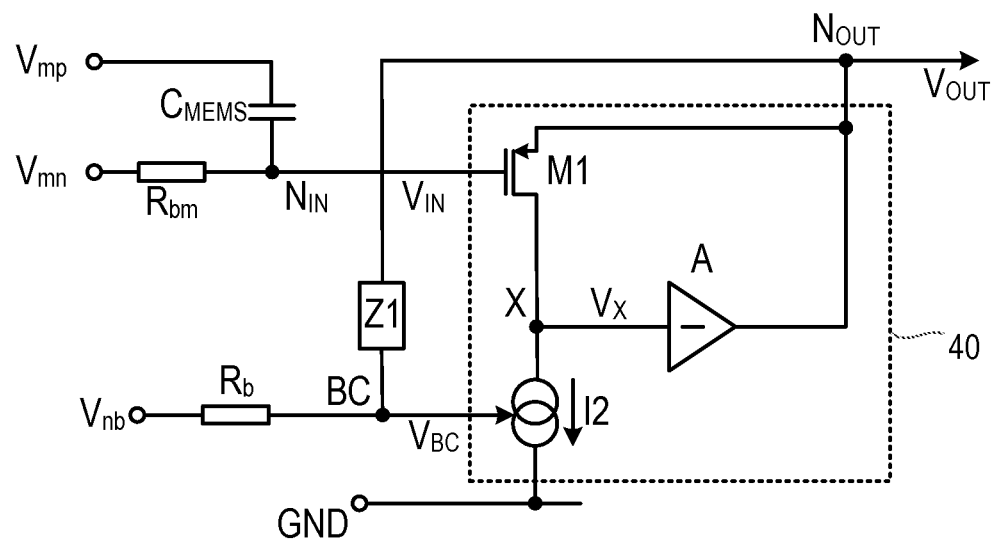
FIG. 4A illustrates another amplifier circuit according to embodiments of the present invention.

FIG. 4A illustrates an alternative amplifier circuit according to an embodiment of the invention. In FIG. 4A, any components which are similar to those described with reference to FIG. 3B have been given the same references. The dotted box 40 encloses super source follower circuitry comprising elements M1, I2 and A. In this embodiment, feedback of the output signal $V_{OUT}$ to the bias control terminal BC is provided by a feedback impedance network Z1. Feedback impedance network Z1 has a first port connected to the amplifier output node $N_{OUT}$ and a second port connected to the bias control node BC. This feedback impedance network may consist of a single capacitor as previously discussed in relation to FIG. 3A, or may be a capacitor potential divider to ground as discussed in relation to FIG. 3B.

As used herein the term feedback impedance network shall be taken to mean a network of one or more impedance elements with at least first and second ports for forming connections to the network. A port in the feedback impedance network is a connection point for delivering a signal or voltage (or current) to or from the impedance network. For example a port of the feedback impedance network may be any connection to a point in the network for example a terminal or node of the network and/or a tap and/or feed point for the network. For the avoidance of doubt the term feedback impedance network includes a single impedance element directly connected between first and second ports, although as will be explained in more detail below the feedback impedance network may in some embodiments comprise more than one impedance element, such as resistors and/or capacitors which may, in some embodiments, be switchably connected to ports of the network.

Figure 4D:
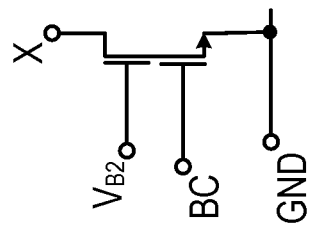
FIG. 4D illustrates another example of a controlled current source for use in FIG. 4A.
Figure 4C:
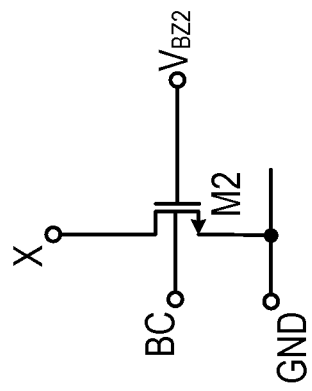
FIG. 4C illustrates an example of a controlled current source for use in FIG. 4A.
Figure 4B:
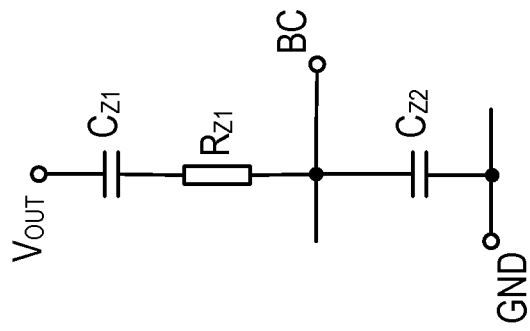
FIG. 4B illustrates an example of a feedback impedance network which could be implemented in FIG. 4A.

In such circuits, the feedback is superimposed on, i.e. is combined with or modulates, a d.c. or quiescent value defined by a voltage applied via a high value bias resistance Rb, with which the capacitors form a high pass filter. Thus the gain enhancement is operative and constant over a signal band above the high pass filter corner frequency defined by the impedance network Z1 and the resistance Rb. In some embodiments, the feedback network may be more complicated, for example, significant resistances, $R_{Z1}$, might be connected in series with the capacitors as illustrated in FIG. 4B to provide a different filtering of the feedback signal and thus give a frequency response which varies across a signal band.

The controlled current source I2 may be a simple MOS transistor M2, with the gate connected to the bias control node BC. It will be appreciated that other possible controlled current sources exist. For example, as illustrated in FIG. 4C the gate node of the transistor M2 may be connected to a suitable bias voltage $V_{BZ2}$ with the bias control node BC connected to the bulk terminal of the transistor M2, thus operating as a controlled back gate terminal. Other MOS structures could be used, for example dual-gate transistors with a single channel with different channel regions controlled by respective separate gate electrodes are known, and may be used as illustrated in FIG. 4D. Alternatively, a JFET might be used with either the normal or the back-gate terminal used.

The bias resistance $R_b$ illustrated in FIG. 4A may be implemented by any suitable high impedance structure, as discussed below.

Figure 4E:
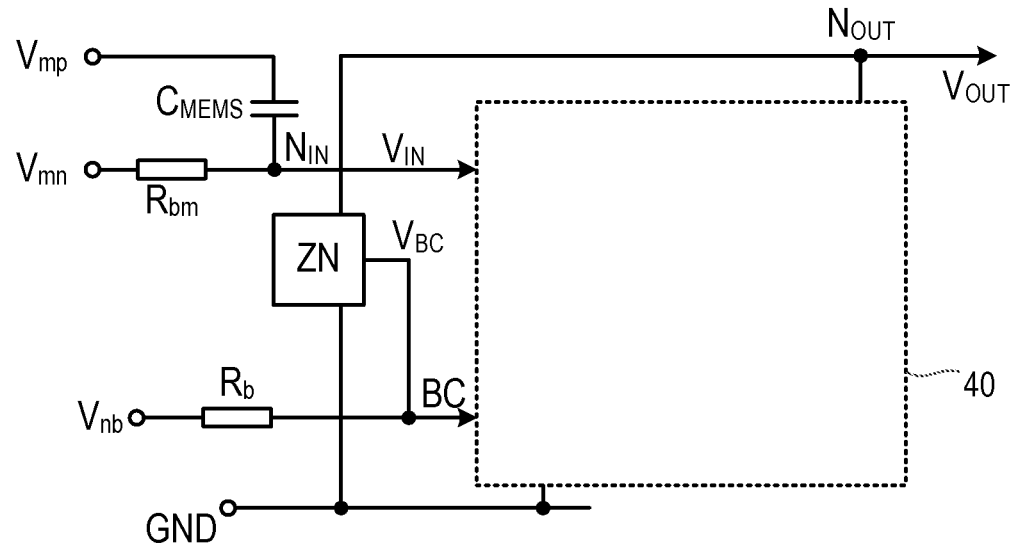
FIG. 4E illustrates an alternative amplifier circuit according to an embodiment of the invention.
Figure 4F:
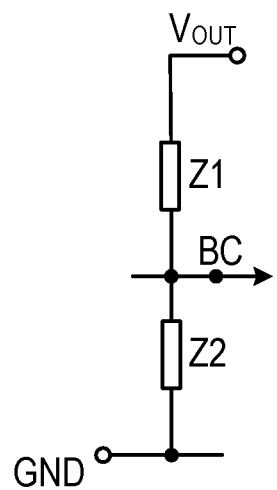
FIG. 4F illustrates an embodiment of the feedback impedance network.

FIG. 4E illustrates an alternative amplifier circuit according to an embodiment of the invention. In FIG. 4E, any components which are similar to those described with reference to FIG. 4A have been given the same reference names. In this embodiment, the feedback of the output signal $V_{OUT}$ to the bias control terminal BC is provided by a feedback impedance network ZN. This operates similarly to the impedance network Z1 of FIG. 4A, but in this embodiment, the optional third port of the feedback impedance network ZN is explicitly shown, and the internal details of the super source follower circuit denoted by dotted box 40 are omitted for clarity. FIG. 4F illustrates an embodiment of the feedback impedance network ZN comprising two impedances configured as a potential divider.

Figure 5A:
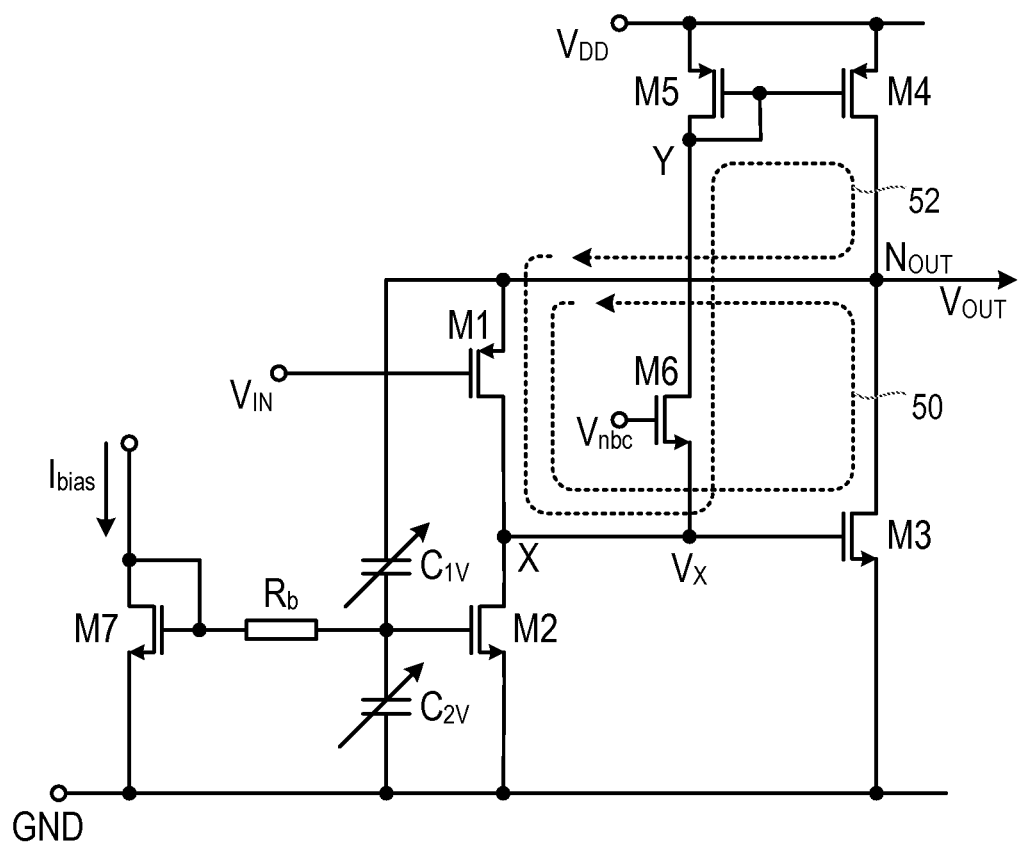
FIG. 5A illustrates a further embodiment of an amplifier circuit according to embodiments of the present invention.

FIG. 5A illustrates an amplifier circuit according to an embodiment of the invention in more detail. In FIG. 5A any components which are similar to those described with reference to FIG. 3B have been given the same reference names. The MEMS transducer has been omitted for clarity. In this embodiment, the inverting output gain stage A is implemented by transistors M3, M4, M5 and M6 where, in this case, M4 and M5 are PMOS transistors and M3 and M6 are NMOS transistors. The transistors M1, M2, M3, M4, M5 and M6 form an embodiment of a Class AB super source follower. It will be appreciated that the polarity of these transistors may be changed in a suitable way, whilst still maintaining the functionality of the invention.

The first and second transistors M1 and M2 are connected in series between the reference voltage, for example ground, and the output voltage $V_{OUT}$, similarly to the embodiments of FIGS. 3 and 4. The transistor M3 is connected between the output voltage $V_{OUT}$ and the reference voltage. In this example, the source nodes of both of the transistors M2 and M3 are connected to the reference voltage, and the drain nodes of both the transistors M1 and M2 are connected together and to the gate node of the transistor M3 at the node X.

Referring back to FIG. 5A, ignoring the presence of capacitors $C_{1V}$ and $C_{2V}$ for now, it can be seen that the transistors M1, M2 and M3 provide a super source follower where the transistor M2 acts as a reference current source. The negative feedback loop provided by the transistors M1 and M3 is shown by the dotted line labelled 50.

In this embodiment, a further negative feedback loop 52 is provided by the inclusion of the transistors M5 and M6 used to provide a drive voltage to the transistor M4. The transistors M5 and M6 are connected in series between the supply voltage $V_{DD}$ and the input node to the output stage, which, in this embodiment, is the gate node of the transistor M3. The transistor M6 is connected between the input node to the output stage and the transistor M5. In this example, the source node of the transistor M6 is coupled to the gate node of the transistor M3 and the drain nodes of the transistors M1 and M2. The drain nodes of the transistors M5 and M6 are coupled to each other and to the gate nodes of the transistors M5 and M4. The source nodes of the transistors M5 and M4 are connected to the supply voltage $V_{DD}$. The gate node of the transistor M6 is biased by a suitable voltage $V_{nbc}$.

In operation, an increase in the output voltage $N_{OUT}$ due to say an injected test stimulus tends to cause an increase in current through the transistor M1 and thus an increase in the voltage $V_X$. This increases the current through the transistor M3. The increase in the voltage $V_X$ also reduces the current through the transistor M6 and thus also decreases the current through the transistor M5 and thus through the transistor M4. The output voltage $N_{OUT}$ is thus restored not only by the increase in current through the transistor M3 but also by a decrease in current through the transistor M4. Thus the transistors M4, M5 and M6 comprise an output stage which also provides super source follower action in conjunction with the transistors M1 and M2.

The circuitry comprising the two feedback loops 50 and 52 operates to provide a Class AB super source follower i.e. the output stage consists of a PMOS and an NMOS transistor.

When the amplifier circuit has to sink current, the transistor M3 will provide this current and when the amplifier circuit has to source current, the transistor M4 will provide this current. In both of the sink and source cases, one of the transistors M3 or M4 will be providing significant output stage transconductance. This is in contrast to a Class A output stage, in which, when sourcing a large output current, the output sink driver transistor M3 may be nearly cut off, and thus may provide only a weak transconductance which can lead to problems in the stability of the super source follower negative feedback loop. In other words, the Class AB output stage transistors M3 and M4 may typically be able to be biased at a quiescent current lower than a similar Class A output stage, whilst still being able to provide equivalent worst-case stability characteristics.

In alternative embodiments, an additional current source may be provided in parallel with M4 between the supply voltage $V_{DD}$ and the source terminal of the transistor M1 to provide its quiescent current demand. However, in general, it is preferable to rely on a suitable sized transistor M4 to provide this current in addition to any load current and the current through sink transistor M3, in order to maximise the transconductance of the transistor M4. The current though source transistor M4 is then efficiently reused from the output stage transistor M4 into the input transistor M1.

The bias voltage $V_{nb}$ may be provided by biasing circuitry which includes an NMOS transistor M7 which is supplied with a biasing current $I_{bias}$. The transistors M7 and M2 thus operate as a current mirror, which may possibly be ratioed to define the quiescent current through the transistor M2. This quiescent current is then modulated by the signal injected via the feedback network including the capacitor $C_{1V}$ and $C_{2V}$.

Also illustrated in this embodiment, is that the capacitor $C_1$ may be implemented by a variable capacitor $C_{1V}$, and the capacitor $C_2$ may be implemented by a variable capacitor $C_{2V}$. The capacitance of variable capacitors $C_{1V}$ or $C_{2V}$ may be programmable. This means that the output gain provided by the amplifier circuit can be programmed, i.e. controllably varied, as it depends on the value of the capacitance of $C_{1V}$ and $C_{2V}$. Thus the capacitors $C_{1V}$ and $C_{2V}$ collectively form a controllably variable potential divider. This means that the amplifier circuit may be calibrated to produce a desired output voltage when a particular level of acoustic stimulus is incident on the MEMS transducer. This then helps to overcome problems produced by MEMS manufacturing inaccuracies, which lead to slightly different responses between MEMS transducers which are intended to be identical.

As mentioned above, in embodiments of the invention a signal derived from the output signal $V_{OUT}$ may be attenuated or level shifted and used to vary the gain of the amplifier circuit. The gain may be programmable i.e. selectively controllable. As mentioned, this may be useful for a variety of reasons such as compensating for any variations due to manufacturing tolerance or the like. The ability to controllably vary the gain represents another novel and advantageous aspect of embodiments of the present invention.

Figure 5B:
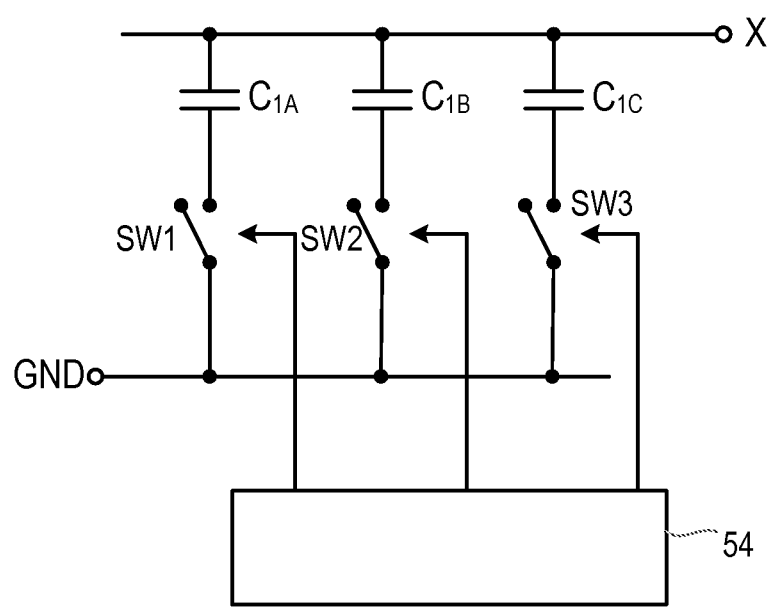
FIG. 5B illustrates an example of how the variable capacitor may be implemented in some embodiments of the invention.

As illustrated in FIG. 5B, the variable capacitor $C_{2V}$ may be implemented as a bank of capacitors in parallel (or possibly series, or some combination of the two) connectable by switches or transmission gates (SW1-SW3) comprising for example MOS transistors. The component capacitor elements may be all similar unit elements, i.e. have the capacitance same values, or alternatively may, for example, be binary weighted. These switches SW-SW3 may be controlled by signals from a control block 54. The control block may contain a local digital storage element, for example non-volatile memory, with digital information for controlling the switches. The digital information may, for instance, represent a calibration value or values, as may have been determined in some factory step and/or some start-up or self test routine, for trimming the gain of the amplifier. At least some such digital information may additionally or alternatively be provided to the control block by suitable digital inputs or interfaces (not shown).

Figure 5C:
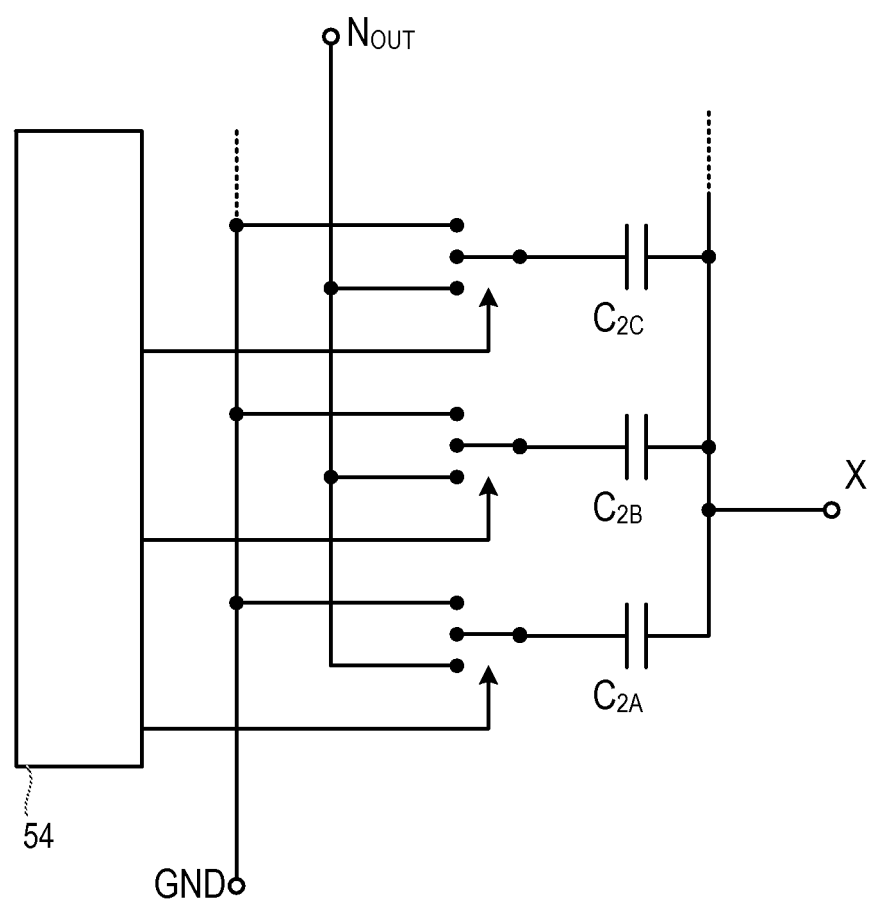
FIG. 5C illustrates an example of how the variable capacitor may be implemented in some embodiments of the invention.

In some embodiments, the variable capacitor $C_{2V}$ may be programmable in addition to or instead of the variable capacitor $C_{1V}$. In some embodiments, at least some of the capacitor elements may be connectable to be part of either $C_{2V}$ or $C_{1V}$ via a suitable switch network as illustrated in FIG. 5C. Similarly to in FIG. 5B, a control block 54 may control the switch network.

The capacitors $C_{2V}$ and/or $C_{1V}$, and hence the signal gain, may be programmable in use, perhaps via on-chip digital registers, or may be programmed during manufacturing tests on the basis of measurements of overall acousto-electric sensitivity, with the switching configuration stored in on-chip non-volatile memory such as EPROM or fuses.

FIG. 6 illustrates an amplifier circuit according to an embodiment of the invention. Any components in this figure which are similar to components shown in previous figures have been given the same reference names. Again, the MEMS transducer has been omitted for clarity.

In this embodiment, the transistor M6, illustrated in FIG. 5A, has been replaced by a composite transistor comprising a PMOS transistor M6B and a NMOS transistor M6A. The gate node of the transistor M6A is provided with a suitable bias voltage $V_{nbc}$. This composite transistor M6A/M6B operates in the amplifier circuit in a similar way to the transistor M6 in previous embodiments, but it takes no current from the node X and thus maintains a higher impedance on the node X and thus avoids decreasing the loop gain. However, the amplifier circuit may require a greater minimum supply voltage due to the extra gate-source voltage drop across the transistor M6B unless, for example, a depletion-mode transistor (not always available on a standard manufacturing process) is used for the transistor M6B to mitigate this.

Also in this embodiment, two capacitors, $C_{C1}$, and $C_{C2}$, i.e. third and fourth capacitors, provide for frequency compensation. In some embodiments and applications, these compensation capacitors may be unnecessary if the poles due to parasitic and output loading at the output voltage terminal $N_{OUT}$ and the node X are spaced far enough apart, but in many embodiments and applications it may be necessary to provide some explicit compensation components.

The first compensation capacitor $C_{C1}$ is coupled between the source node and the drain node of the first transistor M1. The second compensation capacitor $C_{C2}$ is coupled to the source node and the drain node of composite transistor M6A/M6B. These compensation capacitances are especially useful to ensure stability when driving heavy capacitive loads without burning excess quiescent power. It will of course be appreciated that in some embodiments the capacitor $C_{C1}$ may be present even in the absence of the capacitor $C_{C2}$ and likewise the capacitor $C_{C2}$ may be provided in the absence of the capacitor $C_{C1}$.

As in the embodiment of FIG. 5, a bias voltage $V_{nb}$ is generated by passing a suitable bias current $I_{bias}$ across a suitably sized diode-connected transistor M7. As in other embodiments discussed, this voltage $V_{nb}$ is then transferred via a high impedance structure to provide the quiescent voltage on the bias control node BC. At least in integrated circuit implementations, this high impedance structure needs to be of the order of ten gigaohms in order for the time constant generated in conjunction with the integrated capacitors $C_{1V}$ and/or $C_2$, which are of a value in the order of 1 pf, to be of the order of 10 ms. It is impractical to implement this impedance with resistive layers available on most standard manufacturing processes.

Figure 6A:
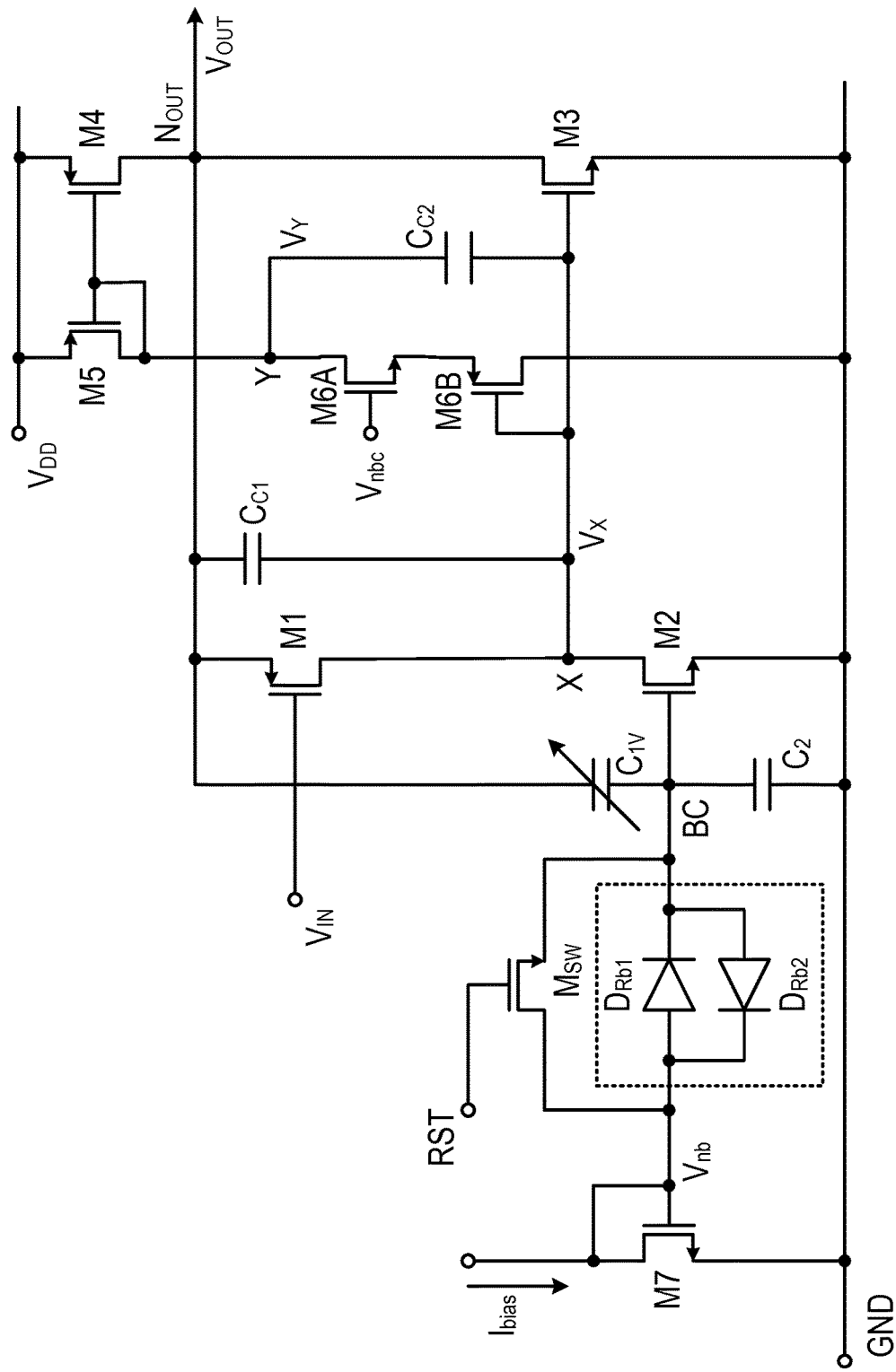
FIG. 6A illustrates a further embodiment of an amplifier circuit according to embodiments of the present invention.

In the embodiment of FIG. 6A, the high impedance structure is implemented using two diodes, $D_{Rb1}$ and $D_{Rb2}$. The slope resistance of each diode near zero current is of the order of $I_S/(k_BT/q)$ where $I_S$ is the saturation current of the diode, $k_B$ is Boltzmann's constant, T is the absolute temperate and q is the electronic charge. The denominator $(k_BT/q)$ is about 25 mV at room temperature. Normal bulk silicon diodes have too low a value of saturation current $I_S$ to be useful, but minimum size poly-silicon diodes have a saturation current $I_S$ of the order of 1 pA, giving a slope impedance of the order of 40 Gohm. The polysilicon diodes are often available on MEMS amplifier integrated circuits, as they are also useful in providing the MEMS transducer bias resistance ($R_{bm}$ of FIG. 1) for similar reasons.

In this example, the diodes $D_{Rb1}$ and $D_{Rb2}$ are implemented in anti-parallel, connected between the gate node of transistor M7, and the gate node of transistor M2. Transistor $M_{SW}$ is connected in parallel with the polysilicon diodes with a control input RST, and can act as a switch to bypass the diodes to initially charge the gate node of the transistor M4. For instance during start-up, system reset, or maybe recovery from overload. It should be appreciated that any suitable form of switch structure could be implemented.

Figure 6C:
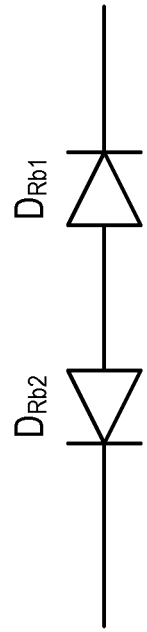
FIG. 6C illustrates an example of the diode network according to some embodiments of the invention.
Figure 6B:
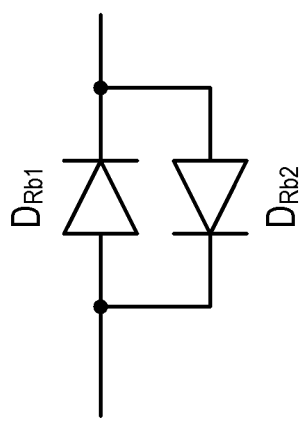
FIG. 6B illustrates an example of the diode network according to some embodiments of the invention.
Figure 6E:
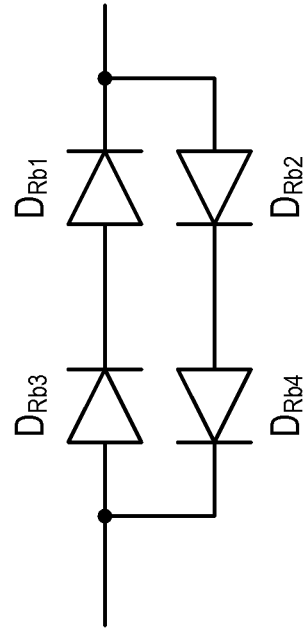
FIG. 6E illustrates an example of the diode network according to some embodiments of the invention.
Figure 6D:
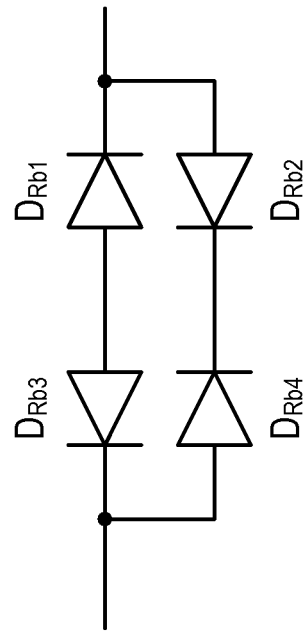
FIG. 6D illustrates an example of the diode network according to some embodiments of the invention.

There are many alternative configurations of diode network to implement this high impedance. FIGS. 6B to 6E illustrate some non-limiting alternatives. The diodes $D_{Rb1}$ and $D_{Rb2}$ could be connected in series, back-to-back, thus keeping a linear and high impedance for a larger signal swing on the transistor M4's gate node as illustrated in FIG. 6C. Series/parallel networks of diodes such as illustrated in FIG. 6D may provide a greater degree of symmetry in the signal response, reducing any signal-generated pumping of the bias control voltage. The impedance may be scaled to a desired value by physically re-sizing each diode appropriately, or by connecting diodes in series or parallel as illustrated in FIG. 6E. More complex networks comprising multiple diodes connected in any form of series/parallel configurations may be implemented to tune and/or make more symmetric the recovery characteristics for excess input signal swings.

As the transistor M7 is used only to supply a bias voltage, and hence there is no signal component associated with this transistor, the noise from it and from upstream bias generation circuitry may be filtered. The diodes $D_{Rb1}$ and $D_{Rb2}$ in conjunction with the various parasitic capacitances present on the gate node of the transistor M2 form a low pass filter to remove said noise.

In some applications, it may be desirable to switch on and off at least part of the functionality of the amplifier circuit. In some embodiments, therefore, one or more switches (not shown) may be included for disabling at least parts of the circuits. For example, switches can be provided in one or more of the following locations: between the transistors M1 and M3, between the gate node of the transistor M3 and the reference voltage and between the gate nodes of transistors the M5 and M4 and the supply voltage $V_{DD}$. The switches may be positioned to ensure that all transistors are properly switched off and that there are no floating nodes than could drift in voltage to turn on some leakage current path between the supplies.

Any number of other switches may be implemented in order to allow for the low noise amplification to be switched on and off. It will be appreciated that the terms connected and coupled in this description therefore mean connected/coupled in use and that hence components may be connected or coupled via a switching element or the like.

Figure 7:
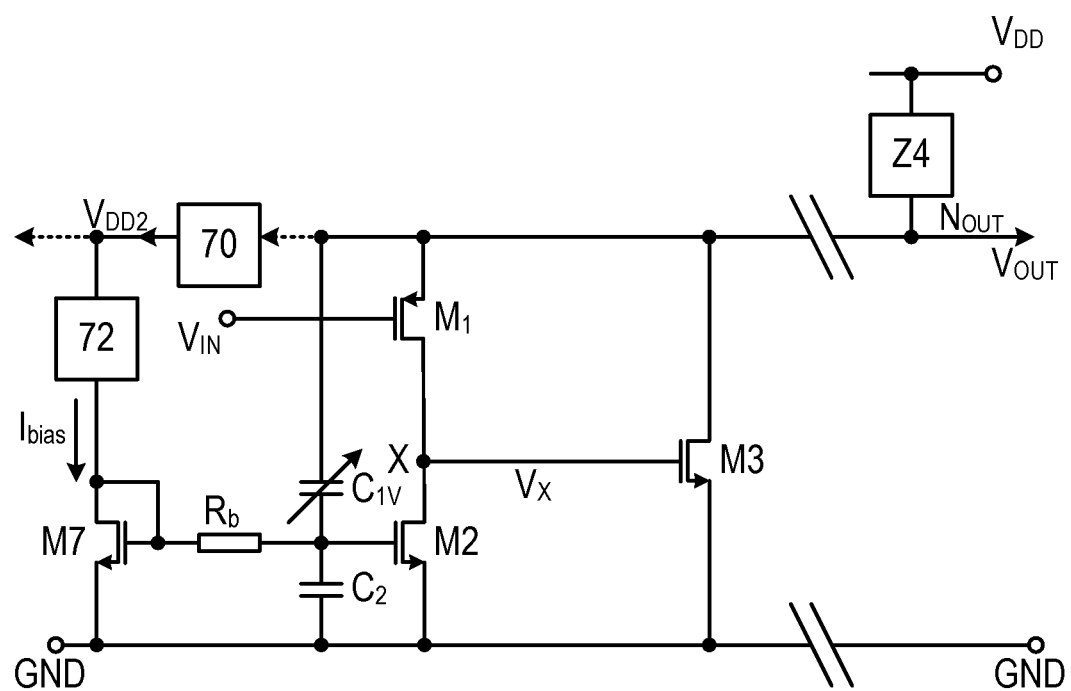
FIG. 7 illustrates a further embodiment of an amplifier circuit according to embodiments of the present invention.

Although the advantages of using a Class AB output stage have been discussed, in some applications it may be advantageous to use a simple Class A output stage. FIG. 7 illustrates a Class A amplifier circuit according to an embodiment of the invention. This circuit is similar to the embodiment of FIG. 3B, with an input stage comprising the transistors M1 and M2. Again, the MEMS transducer is omitted for clarity.

In this embodiment, the inverting output gain stage A of FIG. 3 is implemented as a Class A output stage comprising the transistor M3 with supply current sourced via an impedance element Z4 as illustrated in FIG. 7.

The impedance element Z4 may be implemented as a MOS transistor operating as a constant current source. This Class A amplifier may consume more supply current than a Class AB amplifier, but is simpler and thus possibly cheaper or more compact. Also as discussed in relation to FIG. 6A, in this embodiment the impedance of node X is defined only by the output impedances of the transistors M1 and M2, so the source follower loop gain and thus the improvement in output impedance may be higher than embodiments which take signal-related current to drive the output stage.

The impedance element Z4 may also be a simple resistor. This may be implemented on the same integrated circuit as some or all of the rest of the amplifier circuitry and charge pump and other elements, possibly even including the MEMS transducer, discussed in relation to FIG. 1.

In some applications, the microphone and pre-amplifier may be remote, possibly connected to downstream circuitry via a cable arrangement, for example via a jack connector, or even just more than a centimeter or so away within a portable device such as a cellphone or tablet computer. It may be advantageous to reduce the number of connection lines between the microphone pre-amplifier and the downstream circuit by not providing a separate wire for the power supply to the microphone pre-amplifier. Power supply current may then be supplied down the same wire that is used to transmit the microphone output signal $V_{OUT}$. The embodiment of FIG. 7 includes a power supply block 70 that is used to generate a local power supply $V_{DD2}$ from the output voltage $V_{OUT}$ and powers at least the bias generation block 72 therefrom. In many cases, the power supply current to power the charge pump or bias circuitry collocated with the pre-amplifier may be signal independent and thus will not introduce intolerable spurious audio band signals. The voltage on the wire at the pre-amplifier may be rectified by diodes or other circuitry within the power supply block 70 and low-pass filtered to provide the local power supply voltage $V_{DD2}$, and any residual signal-related supply voltage ripple may be adequately attenuated so as to not feed back into the signal.

The impedance element Z4 may thus be provided simply as a simple discrete resistor close to the downstream circuitry or jack connector. Alternatively, it may be co-integrated with the downstream circuitry, either as a simple on-chip resistance or a MOS current source or other suitable circuitry.

Figure 8:
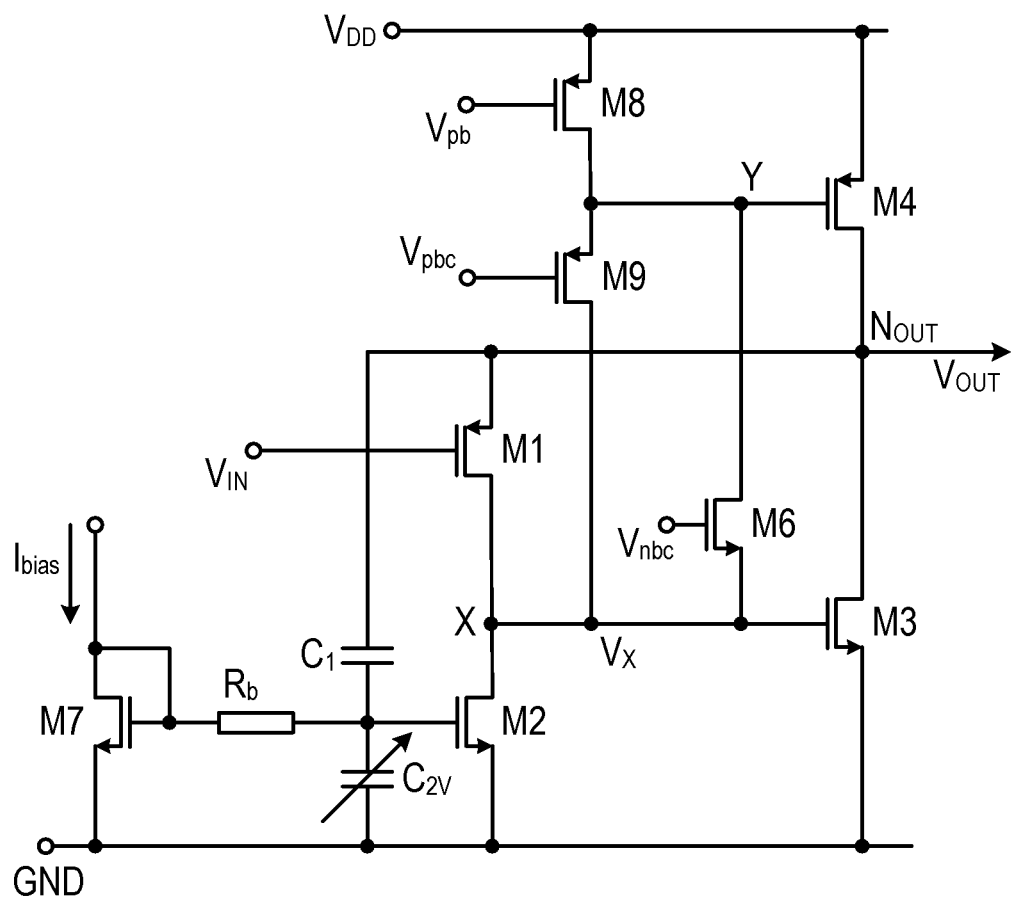
FIG. 8 illustrates a further embodiment of an amplifier circuit according to embodiments of the present invention.

It is also possible to implement other forms of Class AB super source follower output stages which may be able to provide better control. FIG. 8 illustrates an alternative Class AB super source follower output stage according to an embodiment of the invention. In this embodiment, the transistor M5 of previous embodiments, described in reference to FIGS. 5 and 6, has been replaced by transistors M8 and M9 which are both PMOS transistors. The transistors M8 and M9 are connected in series between the gate node of the transistor M3 and the supply voltage $V_{DD}$. The source node of transistor M8 is connected to the voltage $V_{DD}$ and the drain node is connected to the source node of transistor M9 and the gate node of transistor M4. The transistor M8 is biased by a first biasing voltage $V_{b8}$. The drain node of the transistor M9 is connected to the drain node transistor M1, the drain node of transistor M2 and the gate node of transistor M3. The gate node of transistor M9 is biased by a second biasing voltage $V_{b9}$.

This embodiment operates in a similar fashion to the previous Class AB output stages, despite the current of transistor M4 being modulated by the modulation of current drawn through transistor M9, via the consequent modulation of the gate-source voltage of M9, rather than in a more normal current mirror configuration.

The inclusion of the separate transistors M8 and M9 may provide slightly better quiescent current control than the class AB output stage shown in FIGS. 5A and 6A, however, it does require the extra bias lines $V_{b8}$ and $V_{b9}$.

It will be appreciated that in all embodiments the transistors M1-M9 could be implemented by a MOS transistor in series with a resistor, or by a JFET with or without a resistor in series. Furthermore, there will exist equivalent circuits wherein the polarity of some or all of the transistors has been reversed. There may also be equivalent alternative embodiments in which the bulk or body node of a transistor is used as the control node of the transistor rather than the gate, for example as illustrated above with respect to M2 in FIG. 4C.

While components are described as being connected to each other and to circuit nodes, it will be appreciated that such connections may either be direct or indirect. Passive or active components may be inserted in interconnection paths without altering the normal operation of the circuit. For example resistors may be connected in series with the inputs and outputs of the amplifier or elsewhere to improve ESD or EMI performance, cascode devices may be inserted in series with the drains of MOS devices to enhance the output impedance, MOS switches may be inserted in paths to disable any leakage paths in power down modes.

Embodiments of the present invention are particularly applicable to methods for MEMS transducers, especially capacitive transducers such as MEMS microphones. However, the principles of the invention may be applied for amplifying other apparatus such as other capacitive sensors. Embodiments of the invention may be arranged as part of an audio and/or signal processing circuit, for instance an audio circuit which may be provided in a host device and/or accessory device. Embodiments of the invention also relate to MEMS or similar capacitive ultrasonic transducer circuits. An amplifier circuit according to an embodiment of the invention may be implemented as an integrated circuit. In use, a MEMS transducer may form part of the same integrated circuit on a monolithic substrate or be connected to the integrated circuit and co-packaged, or may be separately packaged and connected to the integrated circuit maybe via connections on a printed circuit board (PCB)

Embodiments of the present invention could be used to amplify audio signals in the frequency range of 20 Hz-20 kHz; ultrasonic signals in the frequency range 20 kHz-300 kHz; or haptic signals which are typically below 20 Hz. It will also be appreciated that other types of MEMS capacitive sensors could be implemented, for example accelerometers, pressure sensors, proximity sensors or flow meters.

Embodiments may be implemented in a host device, especially a portable and/or battery powered host device such as a mobile telephone, and audio player, a video player, a PDA, a mobile computing platform such as a laptop computer or tablet and/or a games device for example or in an accessory device, such a headset, earbud (possibly noise-cancelling), or microphone assembly, designed for wired, or wireless connection with such host devices, possibly via multi-wire cables, multi-pole jacks, or optical fibres and connectors.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. An amplifier circuit for receiving an input signal from a MEMS transducer at an input node, and delivering an amplified output signal at an output node, the amplifier circuit comprising:
  an output stage with an output connected to the output node;
  an input stage comprising,
    a first transistor, having its gate node connected to said input node, its source node connected to said output node and its drain node connected to an input of said output stage;
    a current source configured to deliver a current to the drain node of said first transistor, wherein said current source is controlled by a bias control voltage at a bias control node; and
    a feedback impedance network comprising:
      a first port connected to the output node and a second port connected to the bias control node; and
      at least a first capacitor between the first port and the second port.

2. An amplifier circuit for receiving an input signal from a MEMS transducer at an input node, and delivering an amplified output signal at an output node, the amplifier circuit comprising:
  an output stage with an output connected to the output node;
  an input stage comprising,
    a first transistor, having its gate node connected to said input node, its source node connected to said output node and its drain node connected to an input of said output stage;
    a current source configured to deliver a current to the drain node of said first transistor, wherein said current source is controlled by a bias control voltage at a bias control node; and
    a feedback impedance network comprising:
      a first port connected to the output node and a second port connected to the bias control node; and
      a third port connected to a reference voltage such that the feedback impedance network forms a potential divider with the second port delivering an attenuated version of the output signal.

3. An amplifier circuit as claimed in claim 2, wherein the feedback impedance network comprises at least a second capacitor between the second port and the third port.

4. An amplifier circuit as claimed in claim 2, wherein the potential divider is configured as a variable potential divider.

5. An amplifier circuit as claimed in claim 1, wherein the feedback impedance network comprises at least one capacitor and at least one resistor.

6. An amplifier circuit as claimed in claim 1, wherein the feedback impedance network comprises an adjustable capacitance.

7. An amplifier circuit as claimed in claim 1, wherein the feedback impedance network comprises a plurality of capacitive components and a network of switches, said network of switches being configured for selectively connecting one or more of said plurality of capacitive components to the second port.

8. An amplifier circuit as in claim 1, wherein the feedback impedance network comprises a plurality of capacitive components and a network of switches, said network of switches being configured for selectively connecting one or more of said plurality of capacitive components to the first port or the third port.

9. An amplifier circuit as claimed in claim 1, wherein the bias control node is connected to a bias voltage via a high impedance structure.

10. An amplifier circuit as claimed in claim 9, further comprising a switch across the high impedance structure.

11. An amplifier circuit as claimed in claim 1, wherein the current source is a second transistor with its drain node connected to the drain node of the first transistor, its gate node connected to the bias control node, and its source node connected to a reference voltage.

12. An amplifier circuit as claimed in claim 1, wherein the current source is a second transistor with its drain node connected to the drain node of the first transistor, its body node connected to the bias control node, and its source node connected to a reference voltage.

13. An amplifier circuit as claimed in claim 1, wherein the output stage comprises a third transistor with its drain node connected to the output node, its source node connected to a reference voltage, and its gate node connected to the input node of the output stage.

14. An amplifier circuit as claimed in claim 1, comprising a circuit element coupled between a supply voltage and the output node, wherein the circuit element comprises a fourth transistor configured as a constant current source.

15. An amplifier circuit as claimed in claim 14, wherein the drain node of the fourth transistor is connected to the output node, the source node of the fourth transistor is connected to the supply voltage, and the gate node of the fourth transistor is coupled to the input node of the output stage to provide a Class AB output configuration.

16. An amplifier circuit as claimed in claim 15, wherein the drain of the fourth transistor is connected to the output node, the source node is connected to the supply voltage, and the gate node is coupled to a fifth transistor.

17. An amplifier circuit as claimed in claim 16, wherein the gate and drain nodes of the fifth transistor are coupled to the input of the inverting output gain stage to vary the dependence of the fourth transistor on the voltage at said input of the output stage.

18. An integrated circuit comprising an amplifier circuit as claimed in claim 1, wherein said MEMS transducer is formed on a monolithic substrate with said integrated circuit.

19. An amplifier circuit as claimed in claim 1, comprising a MEMS transducer coupled to said input node wherein said MEMS transducer is a MEMS microphone.

20. An electronic device comprising an amplifier circuit as claimed in claim 1, wherein said device comprises at least one of: a portable device; a battery powered device; a computing device; a communications device; an audio device; a personal media player; a games device; a mobile telephone; a laptop computer and a tablet computing device.

* * * * *